(12) United States Patent
Nomura

(10) Patent No.: US 8,436,532 B2
(45) Date of Patent: *May 7, 2013

(54) LIGHTING DEVICE WITH PLURAL LIGHT EMITTING ELEMENTS

(75) Inventor: Ryoji Nomura, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/979,657

(22) Filed: Dec. 28, 2010

(65) Prior Publication Data

US 2011/0140617 A1    Jun. 16, 2011

Related U.S. Application Data

(63) Continuation of application No. 11/661,924, filed as application No. PCT/JP2005/016677 on Sep. 5, 2005, now Pat. No. 7,999,463.

(30) Foreign Application Priority Data

Sep. 13, 2004 (JP) ................................. 2004-265006

(51) Int. Cl.
  *H01L 51/52*  (2006.01)
  *H01L 29/18*  (2006.01)
  *G09G 3/10*   (2006.01)

(52) U.S. Cl.
  USPC ........................ 313/506; 257/88; 315/169.3

(58) Field of Classification Search ............... 257/88, 257/96, E27.121; 313/500, 503–506, 509; 315/169.3; 345/83; 362/217.1; 445/23
See application file for complete search history.

(56) References Cited

U.S. PATENT DOCUMENTS 2,972,692 A    2/1961   William et al.
3,833,833 A    9/1974   Nelson
(Continued)

FOREIGN PATENT DOCUMENTS

CN    1484323      3/2004
EP    0 597 226    5/1994
(Continued)

OTHER PUBLICATIONS

Korean Office Action (Application No. 2007-7007669) Dated Oct. 31, 2011.

(Continued)

*Primary Examiner* — Nimeshkumar Patel
*Assistant Examiner* — Steven Horikoshi
(74) *Attorney, Agent, or Firm* — Eric J. Robinson; Robinson Intellectual Property Law Office, P.C.

(57) ABSTRACT

It is an object of the present invention to provide a light emitting device which is less affected by a malfunction caused in a light emitting element. It is another object of the invention to provide a light emitting device in which light emitting elements are connected in series. As to a light emitting device of the invention, groups of circuits each having a light emitting element and a limiter are connected in parallel. Here, a light emitting element and a limiter are connected in series. The number of the circuits may be at least two or more. Further, each circuit group includes at least one light emitting element.

28 Claims, 12 Drawing Sheets

U.S. PATENT DOCUMENTS

| | | | |
|---|---|---|---|
| 4,298,869 | A | 11/1981 | Okuno |
| 5,939,839 | A | 8/1999 | Robel et al. |
| 6,004,685 | A | 12/1999 | Antoniadis |
| 6,157,127 | A | 12/2000 | Hosokawa et al. |
| 6,335,713 | B1 | 1/2002 | Imai |
| 6,462,722 | B1 | 10/2002 | Kimura et al. |
| 6,522,315 | B2 | 2/2003 | Ozawa et al. |
| 6,693,296 | B1 | 2/2004 | Tyan |
| 6,717,358 | B1 | 4/2004 | Liao et al. |
| 6,747,639 | B2 | 6/2004 | So |
| 6,803,120 | B2 | 10/2004 | Fukuoka et al. |
| 6,839,045 | B2 | 1/2005 | Ozawa et al. |
| 6,866,947 | B1 | 3/2005 | Fukuoka et al. |
| 7,005,196 | B1 | 2/2006 | Carter et al. |
| 7,012,585 | B2 | 3/2006 | Agostinelli et al. |
| 7,034,470 | B2 | 4/2006 | Cok et al. |
| 7,067,392 | B2 | 6/2006 | Yamazaki et al. |
| 7,068,418 | B2 | 6/2006 | Kawase |
| 7,148,632 | B2 | 12/2006 | Berman et al. |
| 7,180,483 | B2 | 2/2007 | Kimura et al. |
| 7,199,516 | B2 | 4/2007 | Seo et al. |
| 7,221,339 | B2 | 5/2007 | Ozawa et al. |
| 7,253,793 | B2 | 8/2007 | Ozawa et al. |
| 7,255,939 | B2 | 8/2007 | Carter et al. |
| 7,271,785 | B2 | 9/2007 | Jang |
| 7,285,801 | B2 | 10/2007 | Eliashevich et al. |
| 7,322,718 | B2 | 1/2008 | Setomoto et al. |
| 7,420,203 | B2 | 9/2008 | Tsutsui et al. |
| 7,468,580 | B2 | 12/2008 | Kawase |
| 7,473,923 | B2 | 1/2009 | Tsutsui et al. |
| 7,495,256 | B2 | 2/2009 | Yamazaki et al. |
| 7,710,364 | B2 | 5/2010 | Ozawa et al. |
| 7,956,349 | B2 | 6/2011 | Tsutsui et al. |
| 7,956,353 | B2 | 6/2011 | Tsutsui et al. |
| 8,013,335 | B2 | 9/2011 | Yamazaki et al. |
| 8,134,153 | B2 | 3/2012 | Yamazaki et al. |
| 2001/0051207 | A1 | 12/2001 | Yamagata et al. |
| 2001/0053462 | A1 | 12/2001 | Mishima |
| 2003/0048072 | A1 | 3/2003 | Ishihara et al. |
| 2003/0113581 | A1 | 6/2003 | Gotou |
| 2003/0117348 | A1 | 6/2003 | Knapp et al. |
| 2003/0141807 | A1 | 7/2003 | Kawase |
| 2003/0151360 | A1 | 8/2003 | Fukunaga et al. |
| 2003/0170491 | A1 | 9/2003 | Liao et al. |
| 2003/0189401 | A1 | 10/2003 | Kido et al. |
| 2003/0227253 | A1 | 12/2003 | Seo et al. |
| 2003/0231273 | A1 | 12/2003 | Kimura et al. |
| 2004/0021413 | A1 | 2/2004 | Ito et al. |
| 2004/0021425 | A1 | 2/2004 | Foust et al. |
| 2004/0031957 | A1 | 2/2004 | Tyan |
| 2004/0032220 | A1 | 2/2004 | Cok et al. |
| 2004/0149984 | A1 | 8/2004 | Tyan et al. |
| 2005/0019606 | A1 | 1/2005 | Fukuoka et al. |
| 2005/0077838 | A1 | 4/2005 | Blumel |
| 2005/0129982 | A1 | 6/2005 | Fukuoka et al. |
| 2005/0218791 | A1 | 10/2005 | Kawase |
| 2005/0225973 | A1 | 10/2005 | Eliashevich et al. |
| 2005/0248267 | A1 | 11/2005 | Gyoutoku et al. |
| 2006/0273995 | A1 | 12/2006 | Ozawa et al. |
| 2006/0273996 | A1 | 12/2006 | Ozawa et al. |
| 2007/0134515 | A1 | 6/2007 | Fukuoka et al. |
| 2007/0182317 | A1 | 8/2007 | Kido et al. |
| 2008/0246704 | A1 | 10/2008 | Kawase |
| 2009/0179561 | A1 | 7/2009 | Fukuoka et al. |
| 2011/0089814 | A1 | 4/2011 | Nomura |
| 2011/0089823 | A1 | 4/2011 | Nomura |
| 2011/0101388 | A1 | 5/2011 | Nomura |
| 2011/0227119 | A1 | 9/2011 | Tsutsui et al. |
| 2011/0227125 | A1 | 9/2011 | Tsutsui et al. |
| 2012/0126234 | A1 | 5/2012 | Yamazaki et al. |

FOREIGN PATENT DOCUMENTS

| | | |
|---|---|---|
| EP | 0 895 219 | 2/1999 |
| EP | 0 917 127 | 5/1999 |
| EP | 1154498 A | 11/2001 |
| EP | 1182244 A | 2/2002 |
| EP | 1 255 240 | 11/2002 |
| EP | 1318553 A | 6/2003 |
| EP | 1 336 953 | 8/2003 |
| EP | 1 337 131 | 8/2003 |
| EP | 1 359 789 | 11/2003 |
| EP | 1 363 265 | 11/2003 |
| EP | 1 388 894 | 2/2004 |
| EP | 1396676 A | 3/2004 |
| EP | 1408563 A | 4/2004 |
| EP | 1443572 A | 8/2004 |
| EP | 1 619 654 | 1/2006 |
| EP | 1905809 A | 4/2008 |
| EP | 1919008 A | 5/2008 |
| EP | 2254155 A | 11/2010 |
| FR | 2058160 | 5/1971 |
| GB | 2371910 | 8/2002 |
| JP | 06-207170 A | 7/1994 |
| JP | 06-208342 | 7/1994 |
| JP | 07-142169 A | 6/1995 |
| JP | 11-233261 A | 8/1999 |
| JP | 11-273856 | 10/1999 |
| JP | 11-307261 A | 11/1999 |
| JP | 11-329734 A | 11/1999 |
| JP | 2000-029404 | 1/2000 |
| JP | 2001-250690 A | 9/2001 |
| JP | 2002-033191 A | 1/2002 |
| JP | 2002-132218 | 5/2002 |
| JP | 2002-532848 | 10/2002 |
| JP | 2003-264085 A | 9/2003 |
| JP | 2003-297573 A | 10/2003 |
| JP | 2004-069774 | 3/2004 |
| JP | 2004-134385 A | 4/2004 |
| JP | 2004-140267 A | 5/2004 |
| JP | 2004-234868 | 8/2004 |
| JP | 2004-235152 A | 8/2004 |
| KR | 2004-0014302 A | 2/2004 |
| KR | 2004-0032765 A | 4/2004 |
| WO | WO 98/36406 | 8/1998 |
| WO | WO 00/36662 | 6/2000 |
| WO | WO 03/037040 | 5/2003 |
| WO | WO-2004/036652 | 4/2004 |
| WO | WO 2004044987 A2 * | 5/2004 |

OTHER PUBLICATIONS

Korean Office Action (Application No. 2010-7029175) Dated Oct. 31, 2011.

Korean Office Action (Application No. 2010-7029929) Dated Oct. 31, 2011.

Korean Office Action (Application No. 2010-7029930) Dated Oct. 31, 2011.

Korean Office Action (Application No. 2010-7029931) Dated Oct. 31, 2011.

Korean Office Action (Application No. 2010-7029932) Dated Oct. 31, 2011.

International Search Report (Application No. PCT/JP2005/016677) dated Oct. 18, 2005.

Written Opinion (Application No. PCT/JP2005/016677) dated Oct. 18, 2005.

Office Action (Application No. 200580030668.X) dated May 30, 2008.

Office Action (Application No. 200580030668.X) dated Nov. 28, 2008.

Tokito et al., "Metal Oxides as a Hole-Injecting Layer for an Organic Electroluminescent Device," J. Phys. D: Appl. Phys (Journal of Physics D: Applied Physics), 1996, vol. 29, pp. 2750-2753.

Office Action (Application No. 200580030668.X) dated Mar. 20, 2009.

Office Action (Application No. 200580030668.X) dated Aug. 7, 2009.

European Search Report (Application No. 05781932.8) dated Oct. 19, 2010.

European Search Report (Application No. 10016210.6) Dated Apr. 6, 2011.

European Search Report (Application No. 10016209.8) Dated Mar. 31, 2011.

European Search Report (Application No. 10016207.2) Dated Mar. 31, 2011.

European Search Report (Application No. 10016208.0) Dated Apr. 4, 2011.
Advisory Action (U.S. Appl. No. 12/979,647) dated May 8, 2012.
Office Action (U.S. Appl. No. 12/979,646) dated Feb. 24, 2012.
Office Action (U.S. Appl. No. 12/979,655) dated Feb. 23, 2012.
Office Action (U.S. Appl. No. 12/979,647) dated Jan. 20, 2012.
Office Action (U.S. Appl. No. 12/979,647) dated Mar. 29, 2012.
Taiwanese Office Action (Application No. 94131350; TW08156) Dated Mar. 6, 2012.
Japanese Office Action (Application No. 2010-286794) dated Dec. 6, 2011.
Japanese Office Action (Application No. 2010-290180) dated Dec. 6, 2011.
Japanese Office Action (Application No. 2010-290183) dated Dec. 6, 2011.
Japanese Office Action (Application No. 2010-290281) dated Dec. 6, 2011.
Office Action (U.S. Appl. No. 12/979,646) dated Jun. 21, 2012.
Office Action (U.S. Appl. No. 12/979,655) dated Jul. 2, 2012.
Taiwanese Office Action (Application No. 094131350) Dated Aug. 28, 2012.
Advisory Action (U.S. Appl. No. 12/979,655) dated Aug. 14, 2012.
Office Action (U.S. Appl. No. 12/979,647) dated Nov. 16, 2012.
Office Action (U.S. Appl. No. 12/979,646) dated Nov. 16, 2012.
Korean Office Action (Application No. 2010-7029932) Dated Nov. 8, 2012.
Notice of Allowance (U.S. Appl. No. 12/979,655) dated Nov. 23, 2012.
Notice of Allowance (U.S. Appl. No. 12/979,647) dated Mar. 12, 2013.
Notice of Allowance (U.S. Appl. No. 12/979,646) dated Mar. 15, 2013.

* cited by examiner

LIGHTING DEVICE WITH PLURAL LIGHT EMITTING ELEMENTS

TECHNICAL FIELD

The present invention relates to a light emitting device, particularly to a light emitting device including a light emitting element having a light emitting layer between a pair of electrodes.

BACKGROUND ART

A light emitting element having a light emitting layer between a pair of electrodes is in actual use as a pixel for operating a display device. In recent years, such a light emitting element attracts attention as a light source of a lighting device as well as a display device.

As to a lighting device, sophistication as required for a display device is not particularly required. However, the influence on a lighting device caused due to a defect of one light emitting element is greater. Specifically, a malfunction in which a light emitting element does not emit light, the illuminance is extremely reduced due to a short-circuit of a light emitting element, or the like can be caused.

DISCLOSURE OF INVENTION

It is an object of the present invention to provide a light emitting device which is less affected by a malfunction caused in a light emitting element. It is another object of the invention to provide a light emitting device in which light emitting elements are connected in series.

As to a light emitting device of the invention, groups of circuits each having a light emitting element and a limiter are connected in parallel. Here, a light emitting element and a limiter are connected in series. The number of the circuits may be at least two or more. Further, each circuit group includes at least one light emitting element.

In the invention, there is not particular limitation on the number of limiters. Accordingly, one circuit group includes at least one limiter. Further, the limiter may be provided closer to either a high potential power supply or a low potential power supply; however, the limiter may preferably be provided on a side where current flows into a circuit group including a light emitting element and the limiter (namely, the limiter is preferably provided closer to a high potential power supply than the light emitting element).

Here, a limiter comprises a circuit having an element or a combination of plural elements, which is used for controlling excess current flown into a light emitting element.

A light emitting device according to the invention includes a first light emitting element and a second light emitting element. The first light emitting element and the second light emitting element each includes a light emitting layer between a first electrode and a second electrode. The first electrode included in the first light emitting element and the second electrode included in the second light emitting element are overlapped and electrically connected.

According to the invention, a malfunction of a light emitting device caused due to short circuit between electrodes in a light emitting element can be reduced. Further, a light emitting device including light emitting elements connected in series, which can be manufactured easily can be obtained according to the invention.

BEST MODE FOR CARRYING OUT THE INVENTION

Embodiment modes of the invention will be hereinafter described in detail with reference to drawings. However, it is easily understood by those skilled in the art that the invention can be implemented in many different modes and various changes may be made in forms and details without departing from the spirit and the scope of the invention. Therefore, the invention should not be limited by the descriptions of embodiment modes below.

Embodiment Mode 1

A mode of a light emitting device of the invention will be described with reference to FIG. 1.

Figure 1:
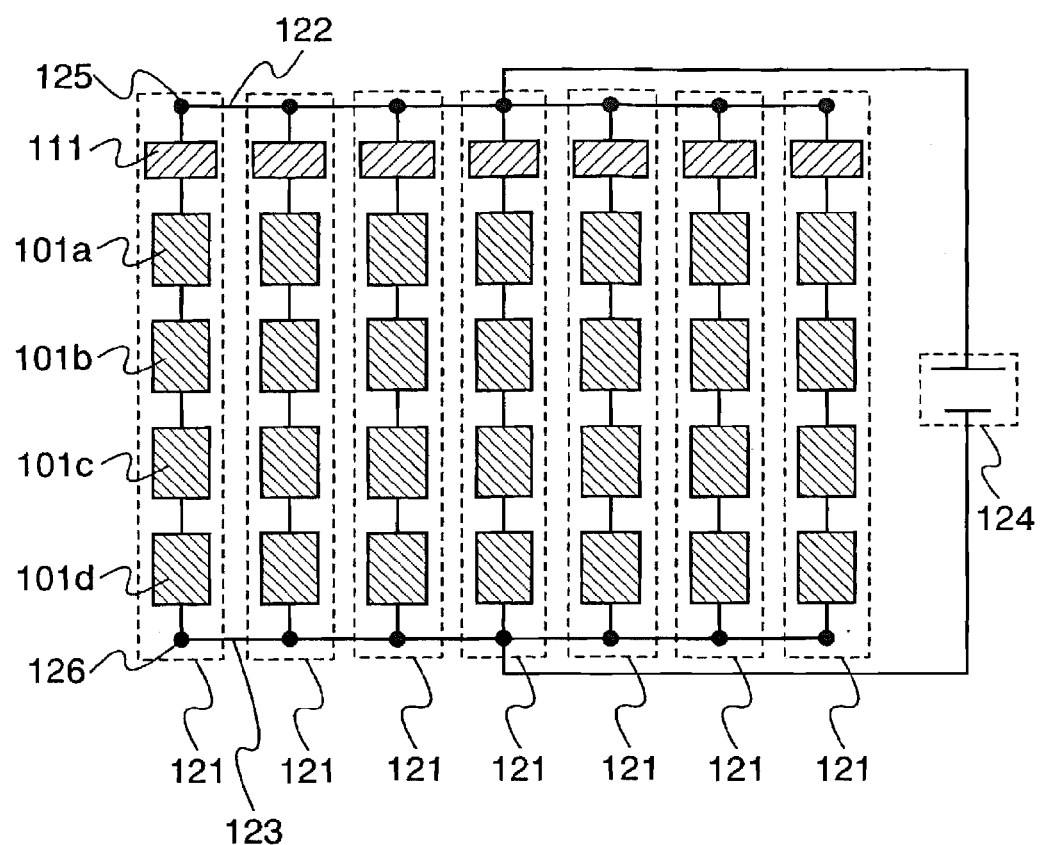
FIG. 1 is a figure showing a mode of a light emitting device according to the present invention.

In FIG. 1, a plurality of groups of circuits 121 each including light emitting elements 101a to 101d and a limiter 111 are connected in parallel.

Figure 2:
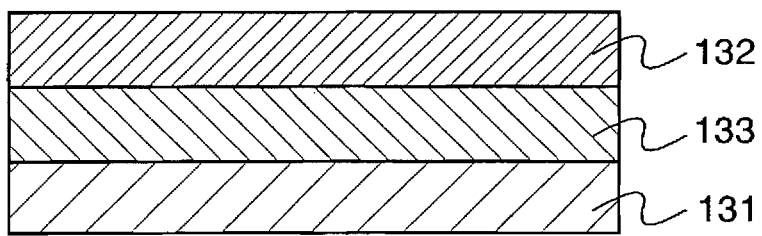
FIG. 2 is a figure showing a mode of a light emitting element in a light emitting device according to the present invention.

In each of the circuits 121, the light emitting elements 101a to 101d and the limiter 111 are respectively connected in series. In FIG. 1, four light emitting elements are included in each of the circuits 121; however, the number of light emitting elements in a circuit is not limited in particular, and a circuit may include at least one light emitting element. Here, the light emitting elements 101a to 101d each has a light emitting layer 133 between a pair of electrodes (a first electrode 131 and a second electrode 132) as shown in FIG. 2.

The limiter 111 is not either limited in particular; it may be any one which can control to prevent excess current flow. For example, the limiter may be composed of one transistor or may be a circuit of a combination of plural elements such as a transistor and a diode.

Figure 10A:
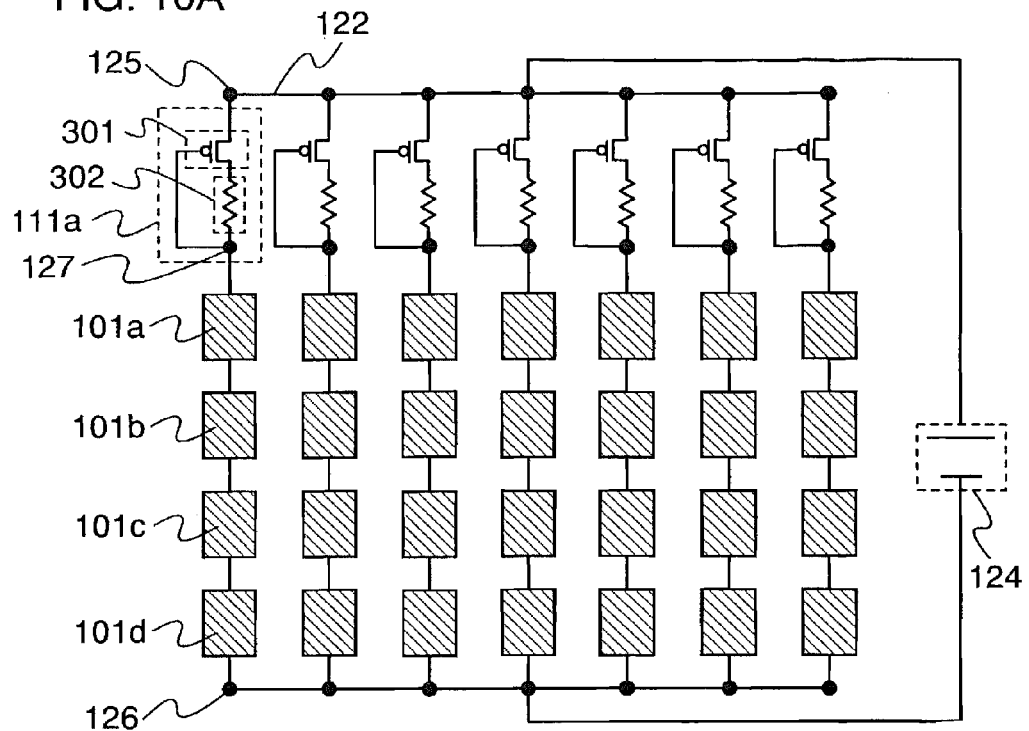
FIG. 10A and FIG. 10B are figures showing a mode of a light emitting device according to the present invention.
Figure 10B:
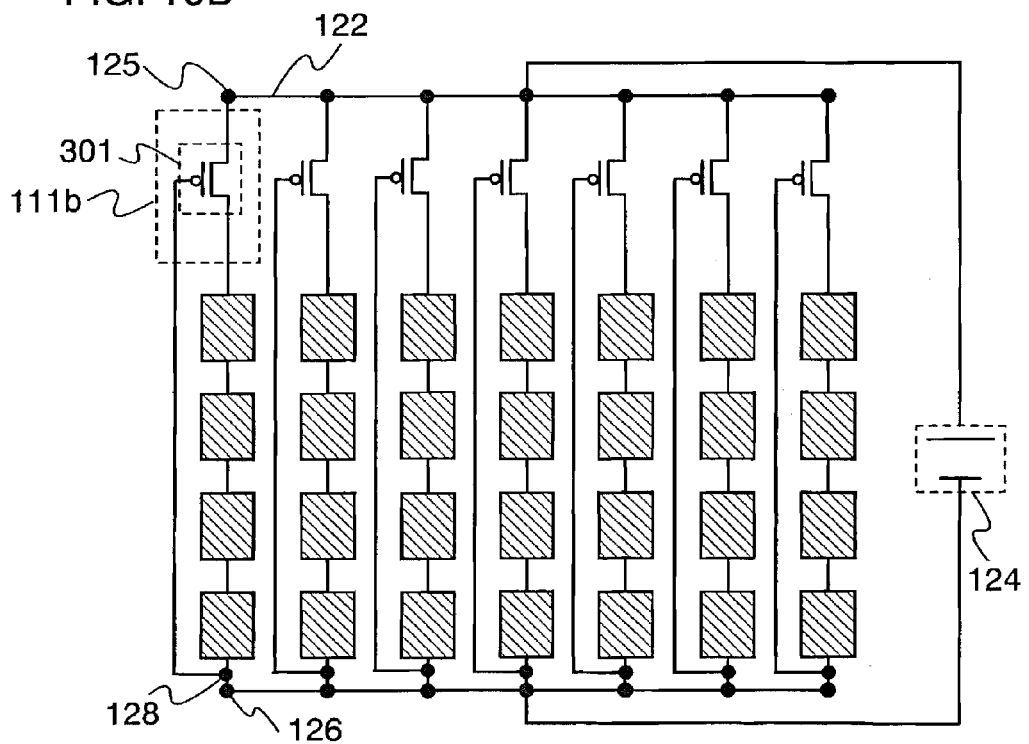
Figure 11:
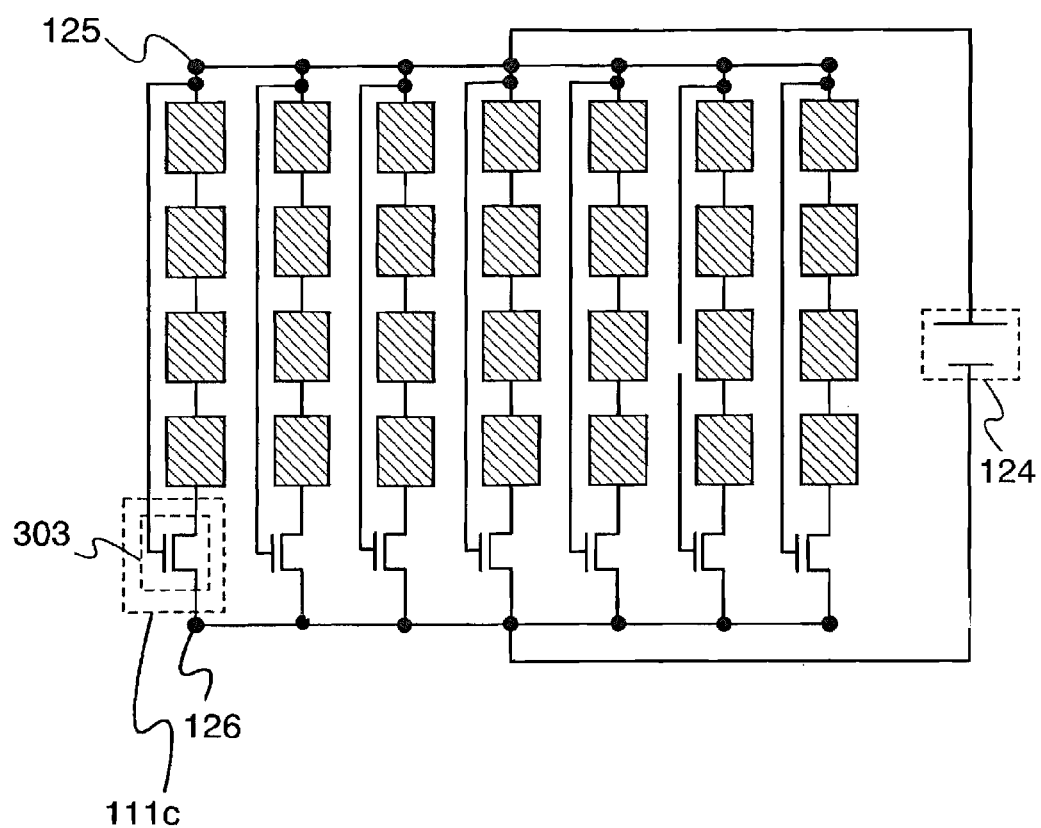
FIG. 11 is a figure showing a mode of a light emitting device according to the present invention.
Figure 12:
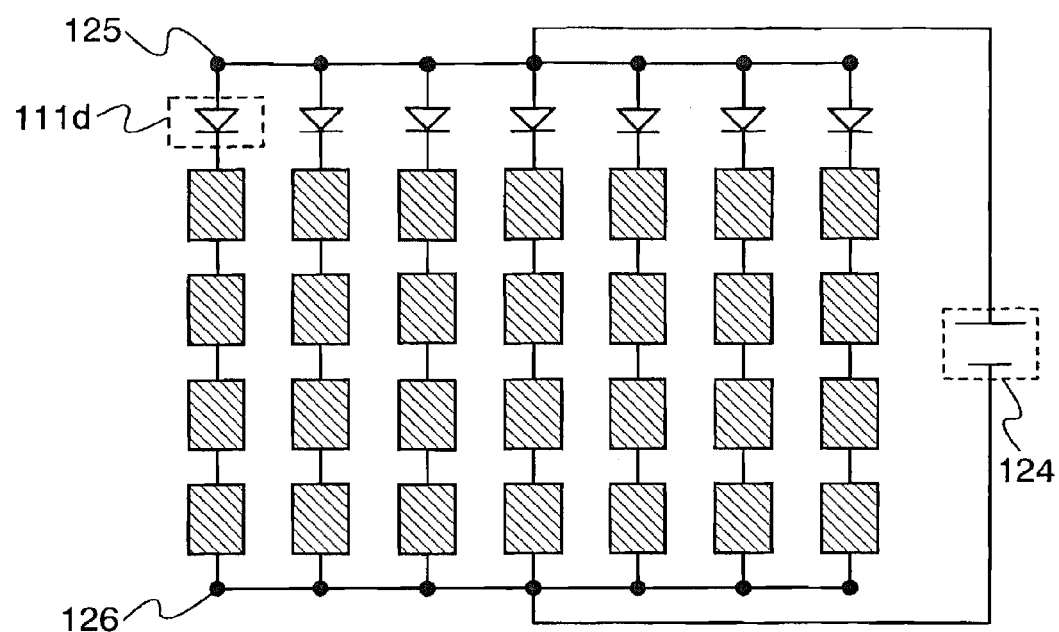
FIG. 12 is a figure showing a mode of a light emitting device according to the present invention.

As the limiter 111, for example, the structure shown in FIG. 10A, FIG. 10B, FIG. 11 or FIG. 12 can be used. However, the structure is not limited to this. FIG. 10A shows a limiter 111a comprising a transistor 301 and a resistor 302. Alternatively, the limiter 111 may comprise either any one of the transistor 301 or the resistor 302 as with a limiter 111b shown in FIG. 10B or a limiter 111c shown in FIG. 11. Here, a gate electrode of the transistor 301 may be connected to a node 127 as shown in FIG. 10A; otherwise the gate electrode of the transistor 301 may be connected to a node 128 as shown in FIG. 10B, for example. In the case where the limiter 111a and the limiter 111b are provided closer to a high potential power supply as shown in FIG. 10A and FIG. 10B, respectively, the transistor 301 may preferably be a p-channel transistor. In the case where the limiter 111c is provided closer to a low potential power supply as shown in FIG. 11, the transistor may preferably be an n-channel transistor 303. Further, the limiter 111 may be a limiter 111d comprising a diode as shown in FIG. 12.

An end of each of the circuits 121 is connected to a wiring 122 at a node 125, and the other end is connected to a wiring 123 at a node 126. The wirings 122 and 123 are connected to a power supply 124.

Voltage is applied to the light emitting elements 101a to 101d from the power supply 124 via the wirings 122 and 123. Potential differences are generated between electrodes in respective light emitting elements 101a to 101d; thus, current flows. After a luminescent material is raised to an excited state due to the flowing current, light is emitted in returning to the ground state. The first electrodes 131 are each connected to the power supply via wirings to be applied with potential having the same polarity. Further, the second electrodes 132 are each connected to the power supply via wirings to be applied with potential having a polarity opposite to the first electrodes. Here, there is no particular limitation on whichever polarity of potential is applied to each electrode.

As to such a light emitting device, although a malfunction such as a short circuit is caused between electrodes in any one of the light emitting elements, good operation can be conducted without placing a significant burden on other light emitting elements.

For example, even in the case where the electrodes of the light emitting element 101b are short-circuited, the other light emitting elements (light emitting elements 101a, 101c, and 101d) can emit light since they are connected in series with each other. Further, even in the case where most or all of the light emitting elements included in any one of the plurality of circuits 121 is short-circuited, excess current does not flow since each of them has the limiter 111, so that current supply to other circuits is not prevented.

As to a light emitting device according to the invention, the first electrode 131 and the second electrode 132 that are included in the light emitting element are not particularly limited; however, it is preferable that at least one of the pair of electrodes can transmit visible light. Thus, light can be emitted from one or both sides of the light emitting device.

Further, the light emitting layer 133 is not either limited in particular. Either or both an organic compound and an inorganic compound are contained in the light emitting layer 133. Further, the light emitting layer 133 may have either a single layer structure or a multilayer structure. In the case of a multilayer structure, luminescent materials having different luminescent colors are made emit light in respective layers, so that the colors are visually recognized to be mixed.

Embodiment Mode 2

In this embodiment mode, a mode of a light emitting element included in a light emitting device according to the present invention will be described with reference to FIG. 3.

Figure 3:
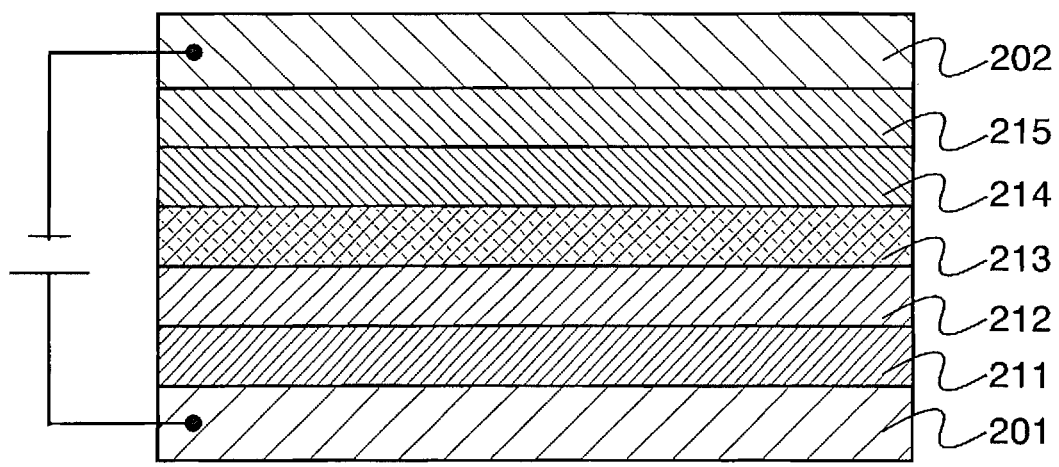
FIG. 3 is a figure showing a mode of a light emitting element in a light emitting device according to the present invention.

FIG. 3 shows a light emitting element that has a light emitting layer 213 between a first electrode 201 and a second electrode 202. In this light emitting element, a hole injected from the first electrode 201 and an electron injected from the second electrode 202 are recombined in the light emitting layer 213 to bring a luminescent material to an excited state. Here, a luminescent material is a substance which can emit light with a desired emission wavelength and has good luminous efficiency. Then, light is emitted when the luminescent material in the excited state returns to the ground state. It is to be noted that the first electrode 201 and the second electrode 202 respectively serve as an anode and a cathode in the light emitting element in the present embodiment mode.

Here, the light emitting layer 213 is not particularly limited. However, it is preferable that the light emitting layer 213 be a layer in which the luminescent material is included so as to be dispersed in a layer formed of a material that has a larger energy gap than the luminescent material has. This makes it possible to prevent quenching of luminescence from the luminescent material due to the concentration. It is to be noted that an energy gap indicates the energy gap between a Lowest Unoccupied Molecular Orbital (LUMO) level and a Highest Occupied Molecular Orbital (HOMO) level.

The luminescent material is not particularly limited. A substance which can emit light with a desired emission wavelength and has good luminous efficiency may be selected and used as the luminescent material. For example, in obtaining red tinged luminescence, a substance which exhibits luminescence with a peak of emission spectrum at 600 nm to 680 nm, such as 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidine-9-yl)ethenyl]-4H-pyran (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, or 2,5-dicyano-1,4-bis-[2-(10-methoxy-1,1,7,7-tetramethyljulolidine-9-yl)ethenyl]benzene can be used. In the case of obtaining green tinged luminescence, a substance which exhibits luminescence with a peak of emission spectrum at 500 nm to 550 nm, such as N,N'-dimethylquinacridone (abbreviation: DMQd), coumarin 6, coumarin 545T, or tris(8-quinolinolato) aluminum (abbreviation: $Alq_3$) can be used. Further, in the case of obtaining blue tinged luminescence, a substance which exhibits luminescence with a peak of emission spectrum at 420 nm to 500 nm, such as 9,10-bis(2-naphthyl)-tert-butylanthracene (abbreviation: t-BuDNA), 9,9'-bianthryl 9,10-diphenylanthracene (abbreviation: DPA), 9,10-bis(2-naphthyl) anthracene (abbreviation: DNA), bis(2-methyl-8-quinolinolato)-4-phenylphenolate-gallium (abbreviation: BGaq), or bis(2-methyl-8-quinolinolato)-4-phenylphenolato-aluminum (abbreviation: BAlq) can be used. In addition to the above fluorescent substances, a phosphorescent substance such as tris(2-phenylpyridine) iridium may be used.

The material used for dispersing the luminescent material is not limited in particular. For example, carbazole derivatives such as 4,4'-bis(N-carbazolyl)-biphenyl (abbreviation: CBP) and 4,4',4"-tris(N-carbazolyl)-triphenylamine (abbreviation: TCTA) and metal complexes such as bis[2-(2-hydroxyphenyl)-pyridinato]zinc (abbreviation: $Znpp_2$), bis[2-(2-hydroxyphenyl)-benzoxazolato]zinc (abbreviation: $Zn(BOX)_2$), and tris(8-quinolinolato) aluminum (abbreviation: $Alq_3$) are preferable in addition to compounds having an arylamine skeleton such as 4,4'-bis[N-(1-naphthyl)-N-phenylamino]-biphenyl (abbreviation: α-NPD).

Although the first electrode 201 is not particularly limited, it is preferable that the first electrode 201 be formed by using a material that has a larger work function when the first electrode 201 functions as an anode as in the present embodiment mode. Specifically, in addition to indium tin oxide (ITO), indium tin oxide containing silicon oxide, and indium oxide including zinc oxide at 2 to 20%, gold (Au), platinum (Pt), nickel (Ni), tungsten (W), chromium (Cr), molybdenum (Mo), iron (Fe), cobalt (Co), copper (Cu), palladium (Pd), and the like can be used. The first electrode 201 can be formed by, for example, sputtering or vapor deposition.

Further, although the second electrode 202 is not particularly limited, it is preferable that the second electrode 202 be formed by using a material that has a smaller work function when the second electrode 202 functions as a cathode as in the present embodiment mode. Specifically, aluminum containing an alkali metal or an alkali-earth metal such as lithium (Li) or magnesium, and the like can be used. The second electrode 202 can be formed by, for example, sputtering or vapor deposition.

In order to extract emitted light to the outside, it is preferable that any one or both the first electrode 201 and the second electrode 202 be an electrode containing a material such as indium tin oxide that can transmit visible light or an electrode formed to a thickness of several to several tens nm so as to transmit visible light.

In addition, a hole transport layer 212 may be provided between the first electrode 201 and the light emitting layer 213 as shown in FIG. 3. Here, a hole transport layer is a layer that has a function of transporting holes injected from an electrode to a light emitting layer. The hole transport layer 212 is provided to keep the first electrode 201 away from the light emitting layer 213 in this way; thus, quenching of luminescence due to a metal can be prevented.

The hole transport layer 212 is not particularly limited, and it is possible to use a layer formed with the use of, for example, an aromatic amine compound (that is, compound including a bond of a benzene ring-nitrogen) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4''-tris(N, N-diphenyl-amino)-triphenylamine (abbreviation: TDATA), or 4,4',4''-tris[N-(3-methylphenyl)-N-phenyl-amino]-triphenylamine (abbreviation: MTDATA). In addition, the hole transport layer 212 may be a layer that has a multilayer structure formed by combining two or more layers each including the material mentioned above.

Further, an electron transport layer 214 may be provided between the second electrode 202 and the light emitting layer 213 as shown in FIG. 3. Here, an electron transport layer is a layer that has a function of transporting electrons injected from an electrode to a light emitting layer. The electron transport layer 214 is provided to keep the second electrode 202 away from the light emitting layer 213 in this way; thus, quenching of luminescence due to a metal can be prevented.

The electron transport layer 214 is not particularly limited, and it is possible to use a layer formed using, for example, a metal complex including a quinoline skeleton or a benzoquinoline skeleton, such as tris(8-quinolinolato) aluminum (abbreviation: $Alq_3$), tris(5-methyl-8-quinolinolato) aluminum (abbreviation: $Almq_3$), bis(10-hydroxybenzo[h]quinolinato) beryllium (abbreviation: $BeBq_2$), or bis(2-methyl-8-quinolinolato)-4-phenylphenolato-aluminum (abbreviation: BAlq). In addition, a layer formed using, for example, a metal complex including a oxazole-based ligand or a thiazole-based ligand such as bis[2-(2-hydroxyphenyl)-benzoxazolato]zinc (abbreviation: $Zn(BOX)_2$) or bis[2-(2-hydroxyphenyl)-benzothiazolato]zinc (abbreviation: $Zn(BTZ)_2$), may be used. Further, a layer formed with the use of 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: to as OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like may be used. In addition, the electron transport layer 214 may be a layer that has a multilayer structure formed by combining two or more layers each including the material mentioned above.

Further, a hole injection layer 211 may be provided between the first electrode 201 and the hole transport layer 212 as shown in FIG. 3. Here, a hole injection layer is a layer that has a function of assisting injection of holes from an electrode serving as an anode to a hole transport layer. It is to be noted that injection of holes into a light emitting layer may be assisted by providing a hole injection layer between an electrode serving as an anode and the light emitting layer when no hole transport layer is particularly provided.

The hole injection layer 211 is not particularly limited, and it is possible to use a layer formed using, for example, a metal oxide such as molybdenum oxide ($MoO_x$), vanadium oxide ($VO_x$), ruthenium oxide ($RuO_x$), tungsten oxide ($WO_x$), manganese oxide ($MnO_x$). In addition, the hole injection layer 211 can be formed using a phthalocyanine compound such as phthalocyanine (abbreviation: $H_2Pc$) or copper phthalocyanine (abbreviation: CuPc), a high polymer such as a poly(ethylenedioxythiophene)/poly(styrene sulfonate) aqueous solution (PEDOT/PSS), or the like.

Further, an electron injection layer 215 may be provided between the second electrode 202 and the electron transport layer 214 as shown in FIG. 3. Here, an electron injection layer is a layer that has a function of assisting injection of electrons from an electrode serving as a cathode to the electron transport layer 214. It is to be noted that injection of electrons into a light emitting layer may be assisted by providing an electron injection layer between an electrode serving as a cathode and the light emitting layer when no electron transport layer is particularly provided.

The electron injection layer 215 is not particularly limited, it is possible to use a layer formed with the use of, for example, a compound of an alkali metal or an alkali-earth metal such as lithium fluoride (LiF), cesium fluoride (CsF), or calcium fluoride ($CaF_2$). In addition, a layer in which a highly electron transportable material such as $Alq_3$ or 4,4-bis(5-methylbenzoxazol-2-yl) stilbene (abbreviation: BzOS) is mixed with an alkali metal or an alkali-earth metal such as magnesium or lithium can also be used as the electron injection layer 215.

In the above-described light emitting element according to the embodiment mode, each of the hole injection layer 211, the hole transport layer 212, the light emitting layer 213, the electron transport layer 214, and the electron injection layer 215 may be formed by any method, for example, vapor deposition, inkjet, or coating. In addition, the first electrode 201 and the second electrode 202 may be formed by any method, for example, sputtering or vapor deposition.

In the above-described light emitting element, since the sum of the thicknesses of the layers provided between the first electrode 201 and the second electrode 202 is as extremely thin as several tens nm to several hundreds nm; therefore, the first electrode 201 and the second electrode 202 can be short circuited. However, by applying the present invention, drop-off in illuminance or the like in the light emitting device can be reduced and the light emitting device can be operated favorably even when electrodes included in the light emitting element are short-circuited.

Embodiment Mode 3

The mode of a light emitting element provided in a light emitting device according to the present invention is not limited to the one described in Embodiment Mode 2. For example, the light emitting element may have a plurality of light emitting layers. For example, white light can be obtained by providing a plurality of light emitting layers and mixing luminescence from respective light emitting layers. In the present embodiment mode, modes of light emitting elements each having a plurality of light emitting layers will be described with reference to FIGS. 4 and 5.

Figure 4:
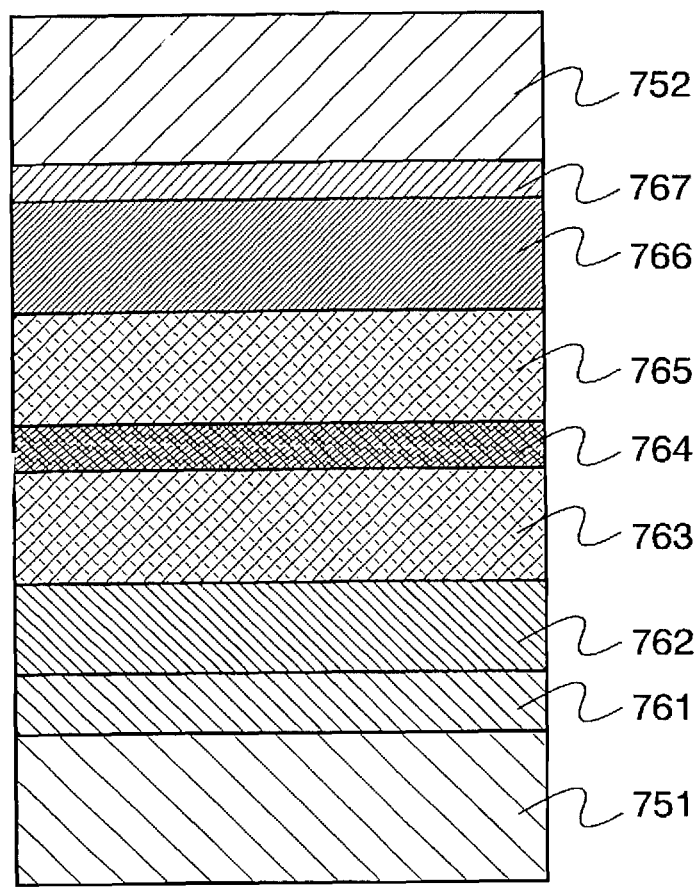
FIG. 4 is a figure showing a mode of a light emitting element in a light emitting device according to the present invention.

In FIG. 4, a first light emitting layer 763 and a second light emitting layer 765 are provided between a first electrode 751 and a second electrode 752. It is preferable to provide a separation layer 764 between the first light emitting layer 763 and the second light emitting layer 765.

When voltage is applied so that the potential of the second electrode 752 is higher than the potential of the first electrode 751, current flows between the first electrode 751 and the second electrode 752, and a hole and an electron are recombined in the first light emitting layer 763, the second light emitting layer 765, or the separation layer 764. Generated excitation energy transfers to both the first light emitting layer 763 and the second light emitting layer 765 through the separation layer 764, and a first luminescent material contained in the first light emitting layer 763 and a second luminescent material included in the second light emitting layer 765 are excited. Then, the excited first and second luminescent materials emit light in returning to the respective ground states.

The first light emitting layer 763 includes a luminescent material typified by a fluorescent material such as perylene, 2,5,8,11-tetra-tert-butylperylene (abbreviation: TBP), 4,4'-bis(2-diphenylvinyl) biphenyl (abbreviation: DPVBi), 4,4'-bis[2-(N-ethylcarbazole-3-yl)vinyl]biphenyl (abbreviation: BCzVBi), bis(2-methyl-8-quinolinolato)-4-phenylphenolato-aluminum (abbreviation: BAlq), or bis(2-methyl-8-quinolinolato)-chlorogallium (Gamq$_2$Cl), or a phosphorescent material such as bis[2-(3,5-bis(trifluoromethyl)phenyl)pyridinato-N,C$^{2'}$]iridium(III)picolinate (abbreviation: Ir(CF$_3$ppy)$_2$(pic)), bis[2-(4,6-difluorophenyl)pyridinato-N,C$^{2'}$]iridium(III)acetylacetonate (abbreviation: FIr(acac)), or bis[2-(4,6-difluorophenyl)pyridinato-N,C$^{2'}$]iridium(III)picolinate (abbreviation: FIr(pic)), from which luminescence with a peak at 450 to 510 nm in an emission spectrum can be obtained. In addition, the second light emitting layer 765 includes a luminescent material serving as a luminescent material, from which luminescence with a peak at 600 to 680 nm in an emission spectrum as in Embodiment Mode 2 can be obtained. Then, the luminescent color of luminescence from the first light emitting layer 763 and the luminescent color of luminescence from the second light emitting layer 765 are emitted to the outside through one or both of the first electrode 751 and the second electrode 752. Luminescence emitted to the outside is visually mixed to be visually recognized as white light.

It is preferable that the first light emitting layer 763 be a layer in which a luminescent material that is capable of exhibiting luminescence of 450 to 510 nm is dispersedly included to be in a layer composed of a material (first host) that has a larger energy gap than the luminescent material, or a layer composed of a luminescent material that is capable of exhibiting luminescence of 450 to 510 nm. As the first host, in addition to α-NPD, CBP, TCTA, Znpp$_2$, and Zn(BOX)$_2$ mentioned above, 9,10-di(2-naphthyl) anthracene (abbreviation: DNA), 9,10-di(2-naphthyl)-2-tert-butylanthracene (abbreviation: t-BuDNA), and the like can be used. Further, it is preferable that the second light emitting layer 765 be a layer in which a luminescent material having a peak at 600 nm to 680 nm in an emission spectrum is dispersedly included in a layer formed of a material (second host) that has a larger energy gap than the luminescent material. As the second host, α-NPD, CBP, TCTA, Znpp$_2$, Zn(BOX)$_2$, Alq$_3$, or the like can be used. Further, it is preferable that the separation layer 764 be formed so that energy generated in the first light emitting layer 763, the second light emitting layer 765, or the separation layer 764 can transfer to both the first light emitting layer 763 and the second light emitting layer 765, and be formed to have a function for preventing energy from transferring only one of the first light emitting layer 763 and the second light emitting layer 765. Specifically, the separation layer 764 can be formed using a organic carrier transport material such as α-NPD, CBP, TCTA, Znpp$_2$, Zn(BOX)$_2$, or the like. As described above, by providing the separation layer 764, the malfunction making it impossible to obtain white light, caused since emission strength of only one of the first light emitting layer 763 and the second light emitting layer 765 becomes stronger, can be prevented.

In the present embodiment mode, the luminescent material contained in each of the first light emitting layer 763 and the second light emitting layer 765 is not particularly limited. The luminescent materials contained in the first light emitting layer 763 and the second light emitting layer 765 can be interchanged; accordingly, the first light emitting layer 763 may contain a luminescent material that is capable of exhibiting luminescence of the longer wavelength, and the luminescent material that is capable of exhibiting luminescence of the shorter wavelength is contained in the second light emitting layer 765 instead. In this case, a luminescent material which easily traps carriers is used for a light emitting layer (the first light emitting layer 763) that is closer to an electrode serving as a cathode (the first electrode 751), the luminescent material included in each layer is made to emit light more efficiently.

In addition, in the present embodiment mode, the light emitting element provided with the two light emitting layers as shown in FIG. 4 is described. However, the number of light emitting layers is not limited to two, and for example, three light emitting layers may be used. Further, luminescence from each light emitting layer may be combined to be visually recognized as white light.

Furthermore, an electron transport layer 762 may be provided between the first light emitting layer 763 and the first electrode 751 as shown in FIG. 4. An electron injection layer 761 may be provided between the electron transport layer 762 and the first electrode 751 in addition to the electron transport layer 762. Further, a hole transport layer 766 may be provided between the second light emitting layer 765 and the second electrode 752 as shown in FIG. 4. Still further, a hole injection layer 767 may be provided between the hole transport layer 766 and the second electrode 752.

Other than the light emitting element described with reference to FIG. 4, a light emitting element shown in FIG. 5 may be used.

Figure 5:
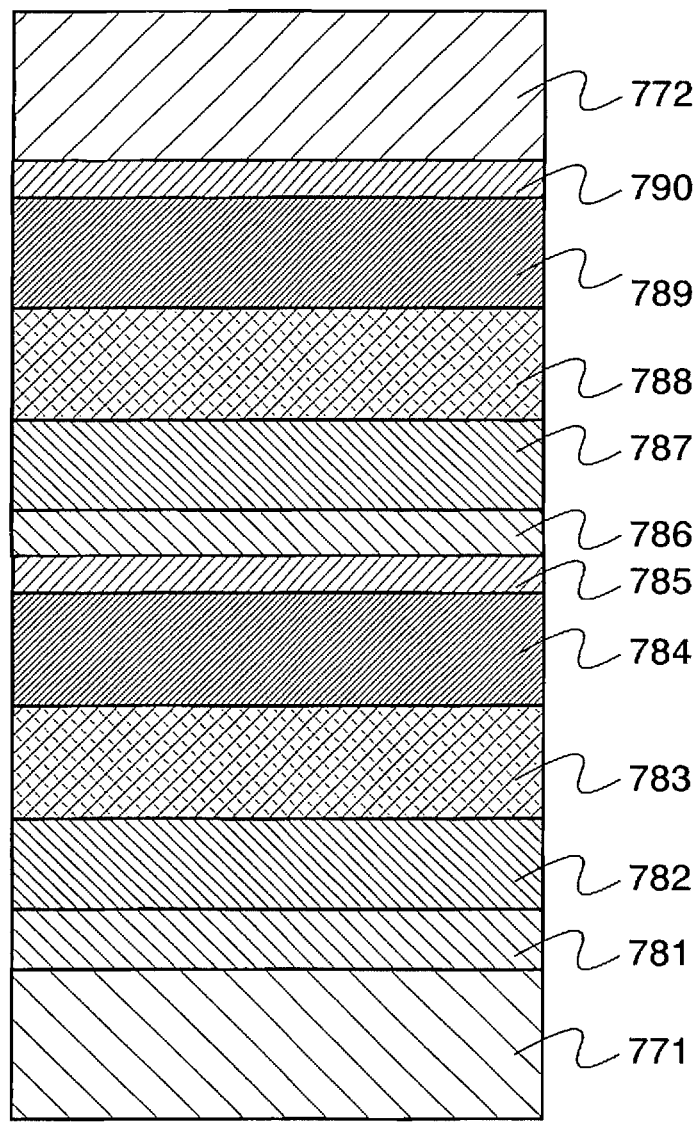
FIG. 5 is a figure showing a mode of a light emitting element in a light emitting device according to the present invention.

The light emitting element shown in FIG. 5 has a first light emitting layer 783 and a second light emitting layer 788 between a first electrode 771 and a second electrode 772. Between the first light emitting layer 783 and the second light emitting layer 788, a first layer 785 and a second layer 786 are provided.

The first layer 785 is a layer that generates holes, and the second layer 786 is a layer that generates electrons. When voltage is applied so that the potential of the second electrode 772 is higher than the potential of the first electrode 771, an electron injected from the first electrode 771 and a hole injected from the first layer 785 are recombined in the first light emitting layer 783, and a luminescent material included in the first light emitting layer 783 emits light. Further, a hole injected from the second electrode 772 and an electron injected from the second layer 786 are recombined in the second light emitting layer 788, and a luminescent material included in the second light emitting layer 788 emits light.

A luminescent material having a peak at 600 nm to 680 nm in an emission spectrum as in Embodiment Mode 2 is contained in the first light emitting layer 783. In addition, the second light emitting layer 788 includes a luminescent material typified by a fluorescent material such as perylene, TBP, DPVBi, BCzVBi, BAlq, or $Gamq_2Cl$, or a phosphorescent material such as $Ir(CF_3ppy)_2(pic)$, FIr(acac), or FIr(pic), from which luminescence with a peak at 450 to 510 nm in an emission spectrum can be obtained. Luminescence from the first light emitting layer 783 and the second light emitting layer 788 is emitted from one or both of the first electrode 771 and the second electrode 772. Then, the luminescence from each light emitting layer is visually mixed to be visually recognized as white light.

In each of the first light emitting layer 783 and the second light emitting layer 788, it is preferable that the luminescent material be dispersedly contained in a host.

It is preferable that the first layer 785 mainly contains a first material which transports more holes than electrons and further contains a second material having electron-acceptor properties to the first material. As the first material, the same material as the material that is used for forming a hole transport layer may be used. In addition, as the second material, such as molybdenum oxide, vanadium oxide, 7,7,8,8-tetracyanoquinodimethane (abbreviation: TCNQ), 2,3,5,6-tetrafluoro-7,7,8,8-tetracyanoquinodimethane (abbreviation: F4-TCNQ) can be used.

It is preferable that the second layer 786 mainly contains a third material which transports more electrons than holes and further contains a fourth material having electron-donor properties to the third material. As the third material, the same material as a material that is used for forming an electron transport layer may be used. In addition, as the fourth material, an alkali metal such as lithium or cesium, an alkaline-earth metal such as magnesium or calcium, a rare-earth metal such as erbium or ytterbium, or the like can be used.

Furthermore, an electron transport layer 782 may be provided between the first light emitting layer 783 and the first electrode 771 as shown in FIG. 5, an electron injection layer 781 may be provided between the electron transport layer 782 and the first electrode 771, a hole transport layer 784 may be provided between the first light emitting layer 783 and the first layer 785. A hole transport layer 789 may be provided between the second light emitting layer 788 and the second electrode 772, and a hole injection layer 790 may be provided between the hole transport layer 789 and the second electrode 772. An electron transport layer 787 may be provided between the second light emitting layer 788 and the second layer 786.

In addition, in the present embodiment mode, the light emitting element provided with the two light emitting layers as shown in FIG. 5 is described. However, the number of light emitting layers is not limited to two, and for example, three light emitting layers may be used. Further, luminescence from each light emitting layer may be combined so as to be visually recognized as white light.

Embodiment Mode 4

In the present embodiment mode, a mode of a structure of a light emitting device according to the present invention will be described with reference to FIGS. 6, 7A, and 7B.

Figure 6:
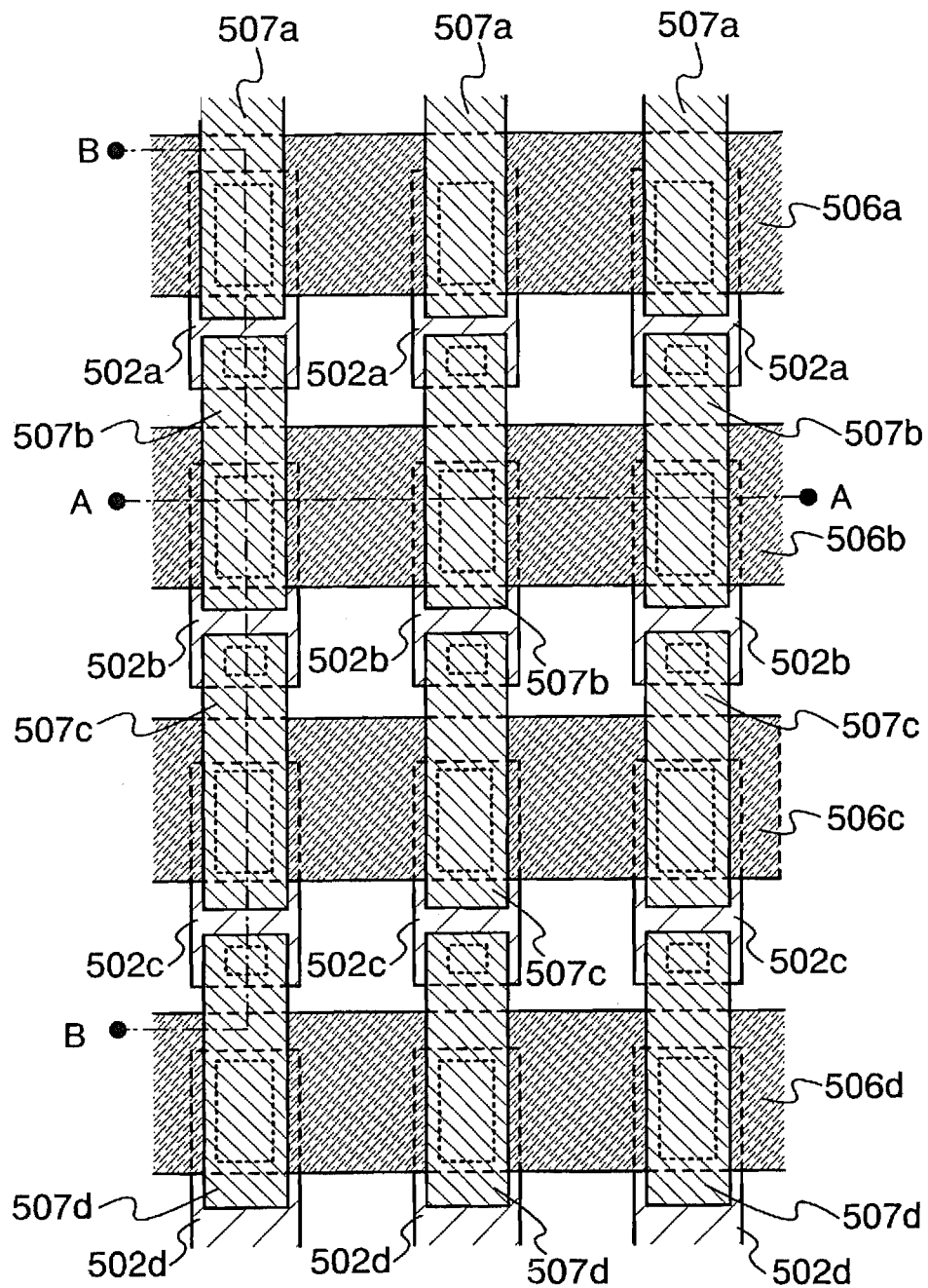
FIG. 6 is a figure showing a mode of a light emitting device according to the present invention.

FIG. 6 is a top view showing a part of a light emitting portion of a light emitting device according to the invention. In FIG. 6, a first electrode 502a, a first electrode 502b, a first electrode 502c, and a first electrode 502d are sequentially arranged in rows. The first electrode 502a, 502b, 502c, and 502d are partially overlapped with respective light emitting layers 506a, 506b, 506c, and 506d and second electrodes 507a, 507b, 507c, and 507d. Further, a part of the first electrode 502a and a part of the second electrode 507b are overlapped, and a part of the first electrode 502b and a part of the second electrode 507c are overlapped. Still further, a part of the first electrode 502c and a part of the second electrode 507d are overlapped. Here, one of the first electrode and the second electrode serves as an anode and the other serves as a cathode.

Figure 7A:
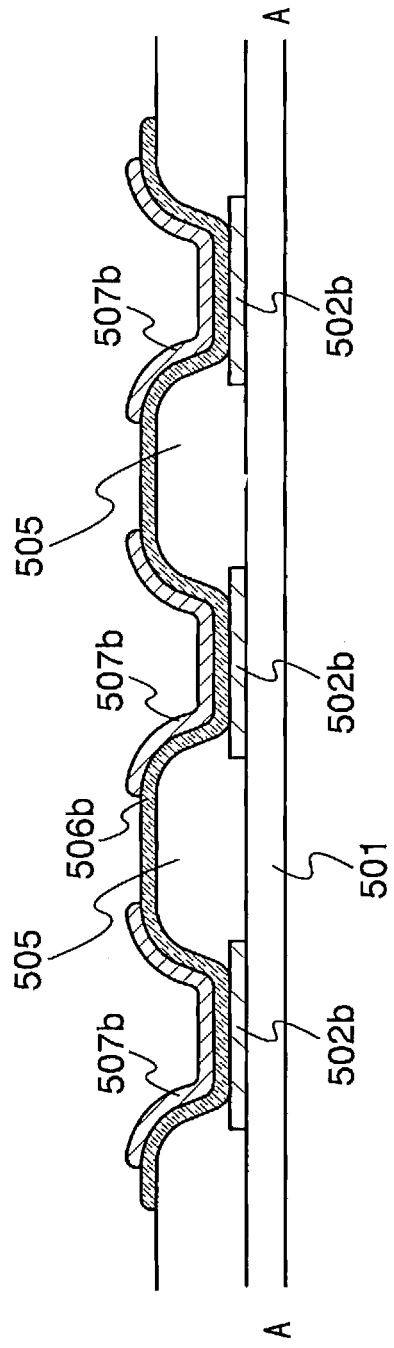
FIGS. 7A and 7B are figures showing a mode of a light emitting device according to the present invention.

FIG. 7A is a cross-sectional view showing a part of a light emitting portion of a light emitting device according to the present invention, and specifically is a cross-sectional view showing a part taken along line A-A' in FIG. 6. In FIG. 7A, a first electrode 502b is provided over the substrate 501 so as to be exposed in an opening of a partition layer 505. A light emitting layer 506b is provided over the first electrode 502b. A second electrode 507b is further provided over the light emitting layer 506b. Thus, a plurality of light emitting elements each having a light emitting layer between a pair of electrodes are independently provided in a part shown by the broken line A-A'.

Figure 7B:
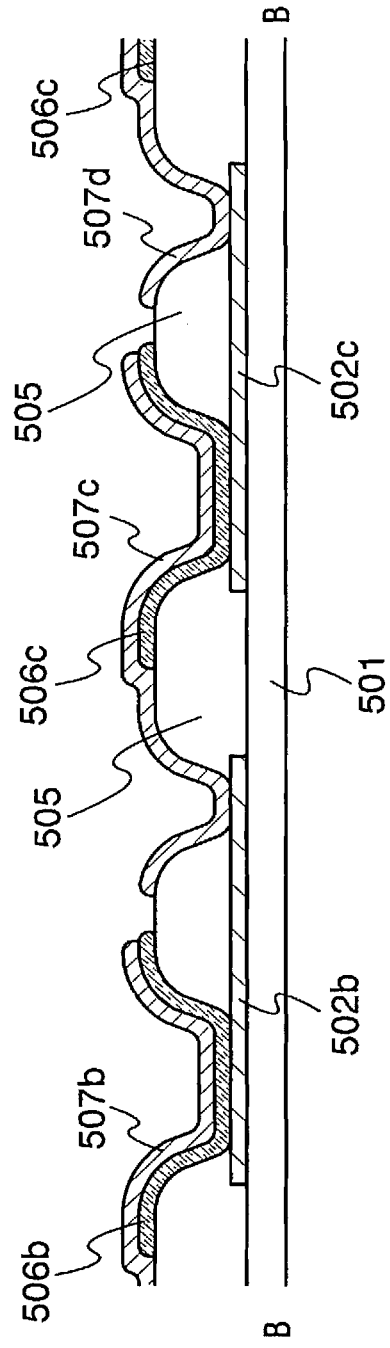

FIG. 7B is also a cross-sectional view showing a part of a light emitting portion of a light emitting device according to the present invention, and specifically is a cross-sectional view showing a part taken along line B-B' in FIG. 6. A substrate 501 in FIG. 7B is the same as a substrate 501 in FIG. 7A. A first electrode 502b in FIG. 7B is the same as the first electrode 502b in FIG. 7A. Other than the first electrode 502b, a first electrode 502c is provided so as to be exposed in an opening of the partition layer 505.

The first electrode 502b and the first electrode 502c are respectively exposed in two openings. In a first opening, the light emitting layer 506b is provided over the first electrode 502b, and a light emitting layer 506c is provided over the first electrode 502c. Further, a second electrode 507c is provided over the first electrode 502c that is exposed in the first opening with the light emitting layer 506c therebetween. A part where the first electrode 502b, the light emitting layer 506b, and the second electrode 507b are overlapped serves as one light emitting element. A part where the first electrode 502c, the light emitting layer 506c, and the second electrode 507c are overlapped serves as another light emitting element. The second electrode 507c is overlapped with and electrically connected to the first electrode 502b in the second opening. As described above, the first electrode included in a first light emitting element is connected to the second electrode included in a second light emitting element; thus, a plurality of light emitting elements each having a light emitting layer between a pair of electrodes are connected in series.

Further, a light emitting element having a structure as shown in FIG. 7B can be manufacture through such a process described below. First, the first electrodes 502a, 502b, 502c, and 502d are formed respectively, and the partition layer is thereafter formed so that each first electrode is exposed in two openings. Light emitting layers 506a, 506b, 506c, and 506d are respectively formed over the respective first electrodes each exposed in one of the openings. At this point of time, the light emitting layers 506a, 506b, 506c, and 506d are preferably formed by a formation method such as an ink-jet method or vapor deposition using a mask, by which a layer can be selectively formed at a desired position. Further, each of the second electrodes 507a, 507b, 507c, and 507d is formed so as to cover the light emitting layer of one of the light emitting elements and the first electrode exposed in the opening of another light emitting element adjacent to the light emitting element. In addition, it is preferable that the second electrodes 507a, 507b, 507c, and 507d are also formed by a formation method such as an ink-jet method or vapor deposition using a mask, by which a layer can be selectively formed at a desired position as well as the light emitting layers. In this manner, serially connected light emitting elements can be manufactured easily.

Embodiment Mode 5

Figure 8:
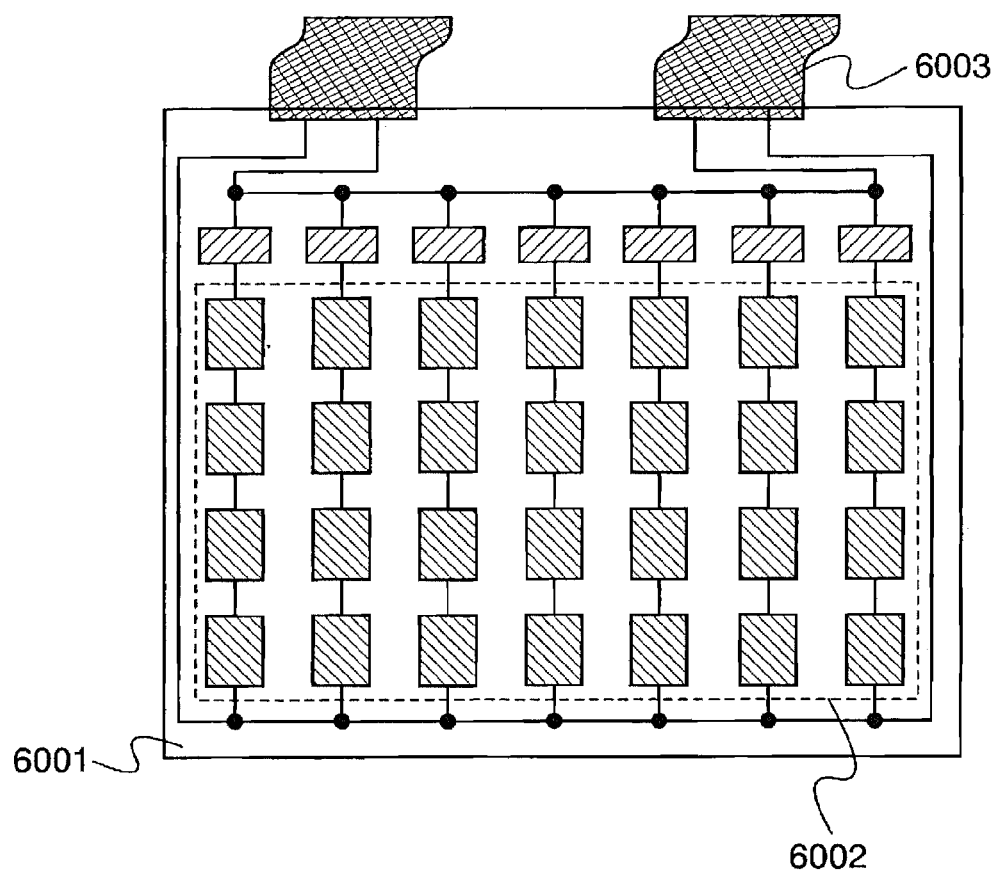
FIG. 8 is a figure showing a mode of a light emitting device according to the present invention.

As shown in FIG. 8, a light emitting device of the present invention includes a support body 6001 and a lighting portion 6002 provided thereover. Further, the light emitting device is equipped with a flexible printed circuit 6003 for connecting the lighting portion 6002 and a power supply. Modes of electronic devices each including such a light emitting device of the invention will be described.

Figure 9A:
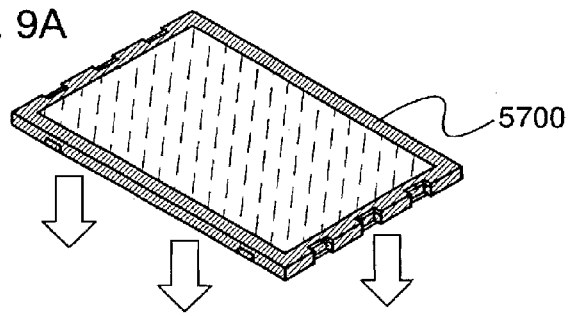
FIGS. 9A to 9C are figures showing a mode of an electronic devise using a light emitting device according to the present invention.

FIG. 9A shows a lighting device to which a light emitting device of the invention is applied. In the lighting device of FIG. 9A, the light emitting device of the invention is mounted in a frame 5700. As to the lighting device in which such a lighting device of the invention is applied to the lighting portion, malfunction due to a defect of a light emitting element can be reduced and good lighting can be performed.

Figure 9B:
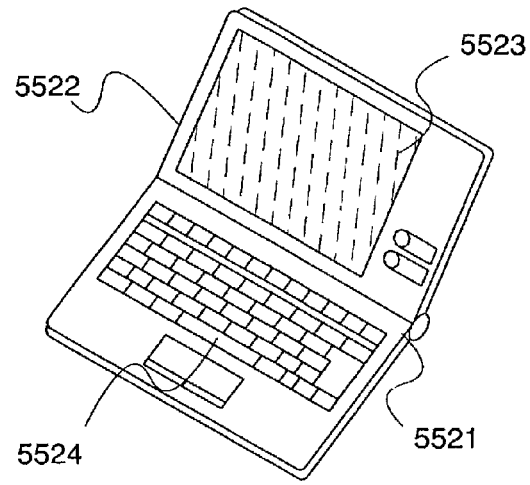
Figure 9C:
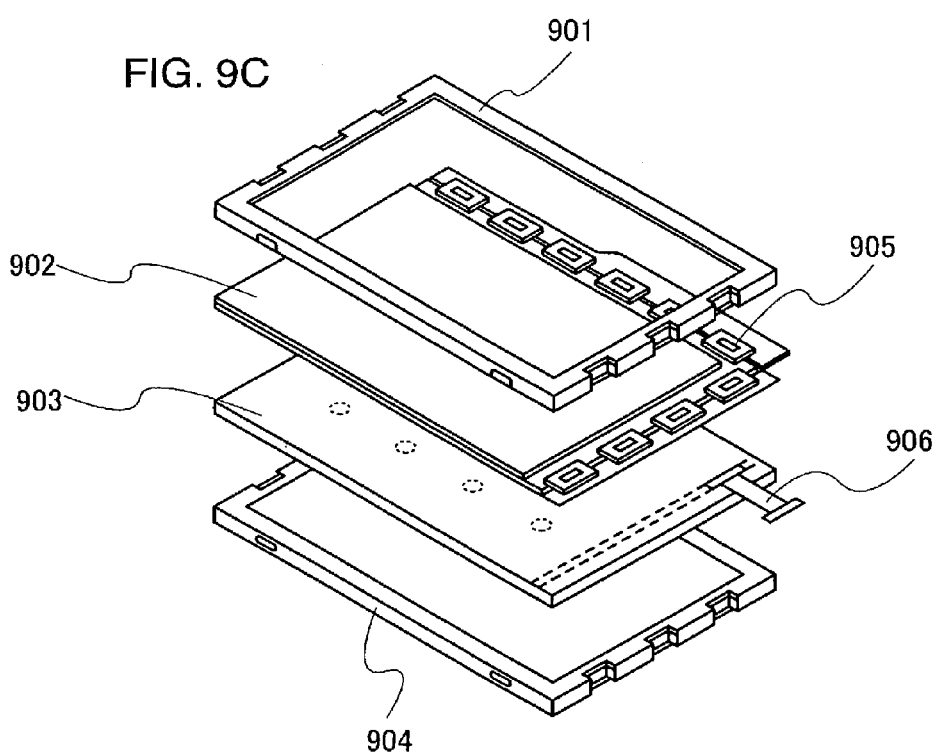

FIG. 9B shows a personal computer in which a light emitting device of the invention is applied to a backlight in a display area 5523. The personal computer includes a main body 5521, a frame 5522, the display area 5523, a keyboard 5524, and the like. Specifically, a liquid crystal device 902 and a backlight 903 is fit between a frame 901 and a frame 904 to be mounted on the personal computer. The liquid crystal display device is operated in accordance with a signal supplied via a driver circuit 905. The backlight 903 is equipped with a flexible printed circuit 906. A signal for controlling the backlight 903 is inputted to the backlight via the flexible printed circuit 906. A light emitting device of the invention is mounted in this manner; thus, malfunction such as a dark spot locally formed due to a defect of the light emitting element can be reduced and good display can be performed.

EXPLANATION OF REFERENCE

101a: a light emitting element, 101b: a light emitting element, 101c: a light emitting element, 101d: a light emitting element, 111: a limiter, 121: a circuit, 122: a wiring, 123: a wiring, 124: a power supply, 125: a node, 126: a node, 127: a node, 128: a node, 131: a first electrode, 132: a second electrode, 133: a light emitting layer, 201: a first electrode, 202: a second electrode, 211: a hole injection layer, 212: a hole transport layer, 213: a light emitting layer, 214: an electron transport layer, 215: an electron injection layer, 751: a first electrode, 752: a second electrode, 761: an electron injection layer, 762: an electron transport layer, 763: a first light emitting layer, 764: a separation layer, 765: a second light emitting layer, 766: a hole transport layer, 767: a hole injection layer, 771: a first electrode, 772: a second electrode, 781: an electron injection layer, 782: an electron transport layer, 783: a first light emitting layer, 784: a hole transport layer, 785: a first layer, 786: a second layer, 787: an electron transport layer, 788: a second light emitting layer, 789: a hole transport layer, 790: a hole injection layer, 501: a substrate, 502a: a first electrode, 502b: a first electrode, 502c: a first electrode, 502d: a first electrode, 505: a partition layer, 506a: a light emitting layer, 506b: a light emitting layer, 506c: a light emitting layer, 506d: a light emitting layer, 507a: a second electrode, 507b: a second electrode, 507c: a second electrode, 507d: a second electrode, 6001: a support body, 6002: a lighting portion. 6503: a flexible printed circuit, 5700: a frame, 5521: a main body, 5522: a frame, 5523: a display area, 5524: a keyboard, 901: a frame, 902: a liquid crystal device, 903: a backlight, 904: a frame, 905: a driver circuit, 906: a flexible printed circuit, 301: a transistor, 302: a resistor, 303: a transistor.

What is claimed is:

1. A lighting device comprising:
a plurality of circuits connected in parallel with each other, each of the plurality of circuits comprising at least one light emitting element which includes:
a first electrode over a substrate;
a light emitting layer over the first electrode; and
a second electrode over the first electrode with the light emitting layer therebetween;
a partition layer covering an edge portion of the first electrode and including an opening over the first electrode; and
a circuit capable of preventing an excess current from flowing into the light emitting element,
wherein part of the light emitting layers is over the partition layer,
wherein the first electrodes of the plurality of circuits are spaced from each other,
wherein the second electrodes of the plurality of circuits are spaced from each other, and
wherein the light emitting layer of the light emitting element of the plurality of circuits is continuous to the light emitting layer of an adjacent one of the light emitting element of the plurality of circuits.

2. The lighting device according to claim 1, wherein the circuit capable of preventing the excess current comprises a transistor.

3. The lighting device according to claim 1, wherein the circuit capable of preventing the excess current comprises a diode.

4. The lighting device according to claim 1, wherein the circuit capable of preventing the excess current is a limiter.

5. The lighting device according to claim 1, wherein the plurality of circuits each are arranged to be applied a voltage simultaneously.

6. The lighting device according to claim 1, wherein the light emitting elements are arranged to emit light simultaneously.

7. A lighting device comprising:
a plurality of circuits connected in parallel with each other, each of the plurality of circuits comprising:
a first light emitting element and a second light emitting element which are connected in series, each comprising:
a first electrode over a substrate;
a light emitting layer over the first electrode; and
a second electrode over the first electrode with the light emitting layer therebetween;
a partition layer covering a first edge portion of the first electrode of the first light emitting element and an edge portion of the first electrode of the second light emitting element, wherein the partition layer includes a first opening over the first electrode of the first light emitting element and a second opening over the first electrode of the second light emitting element; and
a circuit capable of preventing an excess current from flowing into the first light emitting element and the second light emitting element, wherein part of the light emitting layers is over the partition layer, wherein the first electrode of the first light emitting element and the first electrode of the second light emitting element are separated from each other, wherein the light emitting layer of the first light emitting element of the plurality of circuits is continuous to the light emitting layer of an adjacent one of the first light emitting element of the plurality of circuits, and wherein the light emitting layer of the second light emitting element of the plurality of circuits is continuous to the light emitting layer of an adjacent one of the second light emitting element of the plurality of circuits.

8. The lighting device according to claim 7, wherein the circuit capable of preventing the excess current comprises a transistor.

9. The lighting device according to claim 7, wherein the circuit capable of preventing the excess current comprises a diode.

10. The lighting device according to claim 7, wherein the circuit capable of preventing the excess current is a limiter.

11. The lighting device according to claim 7, wherein the light emitting layer of the first light emitting element and the light emitting layer of the second light emitting element are spaced from each other.

12. The lighting device according to claim 7, wherein the second electrode of the first light emitting element is connected to the first electrode of the second light emitting element.

13. The lighting device according to claim 7, wherein the plurality of circuits each are arranged to be applied a voltage simultaneously.

14. The lighting device according to claim 7, wherein the first light emitting element and the second light emitting element are arranged to emit light simultaneously.

15. A lighting device comprising:
a plurality of circuits connected in parallel with each other, each of the plurality of circuits comprising at least one light emitting element which includes:
a first electrode over a substrate;
a light emitting layer over the first electrode; and
a second electrode over the first electrode with the light emitting layer therebetween;
a partition layer covering an edge portion of the first electrode and including an opening over the first electrode; and
a circuit configured to control a current flowing into the light emitting element,
wherein part of the light emitting layers is over the partition layer,
wherein the first electrodes of the plurality of circuits are spaced from each other,
wherein the second electrodes of the plurality of circuits are spaced from each other, and
wherein the light emitting layer of the light emitting element of the plurality of circuits is continuous to the light emitting layer of an adjacent one of the light emitting element of the plurality of circuits.

16. The lighting device according to claim 15, wherein the circuit configured to control the current comprises a transistor.

17. The lighting device according to claim 15, wherein the circuit configured to control the current comprises a diode.

18. The lighting device according to claim 15, wherein the circuit configured to control the current is a limiter.

19. The lighting device according to claim 15, wherein the plurality of circuits each are arranged to be applied a voltage simultaneously.

20. The lighting device according to claim 15, wherein the light emitting elements are arranged to emit light simultaneously.

21. A lighting device comprising:
a plurality of circuits connected in parallel with each other, each of the plurality of circuits comprising:
a first light emitting element and a second light emitting element which are connected in series, each comprising:
a first electrode over a substrate;
a light emitting layer over the first electrode; and
a second electrode over the first electrode with the light emitting layer therebetween; and
a partition layer covering a first edge portion of the first electrode of the first light emitting element and an edge portion of the first electrode of the second light emitting element, wherein the partition layer includes a first opening over the first electrode of the first light emitting element and a second opening over the first electrode of the second light emitting element; and
a circuit configured to control a current flowing into the first light emitting element and the second light emitting element,
wherein part of the light emitting layers is over the partition layer,
wherein the first electrode of the first light emitting element and the first electrode of the second light emitting element are separated from each other,
wherein the light emitting layer of the first light emitting element of the plurality of circuits is continuous to the light emitting layer of an adjacent one of the first light emitting element of the plurality of circuits, and
wherein the light emitting layer of the second light emitting element of the plurality of circuits is continuous to the light emitting layer of an adjacent one of the second light emitting element of the plurality of circuits.

22. The lighting device according to claim 21, wherein the circuit configured to control the current comprises a transistor.

23. The lighting device according to claim 21, wherein the circuit configured to control the current comprises a diode.

24. The lighting device according to claim 21, wherein the circuit configured to control the current is a limiter.

25. The lighting device according to claim 21, wherein the light emitting layer of the first light emitting element and the light emitting layer of the second light emitting element are spaced from each other.

26. The lighting device according to claim 21, wherein the second electrode of the first light emitting element is connected to the first electrode of the second light emitting element.

27. The lighting device according to claim 21, wherein the plurality of circuits each are arranged to be applied a voltage simultaneously.

28. The lighting device according to claim 21, wherein the first light emitting element and the second light emitting element are arranged to emit light simultaneously.

* * * * *